US011254849B2

(12) United States Patent
Tanigawa et al.

(10) Patent No.: US 11,254,849 B2
(45) Date of Patent: Feb. 22, 2022

(54) METHOD FOR PRODUCING A THERMALLY CONDUCTIVE POLYSILOXANE COMPOSITION

(71) Applicant: MOMENTIVE PERFORMANCE MATERIALS JAPAN LLC, Tokyo (JP)

(72) Inventors: Eiji Tanigawa, Tokyo (JP); Masanori Takanashi, Tokyo (JP); Isao Iida, Tokyo (JP); Daigo Hirakawa, Tokyo (JP); Kenji Takenaka, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 0 days.

(21) Appl. No.: 15/772,690

(22) PCT Filed: Nov. 2, 2016

(86) PCT No.: PCT/JP2016/082627
§ 371 (c)(1),
(2) Date: May 1, 2018

(87) PCT Pub. No.: WO2017/078081
PCT Pub. Date: May 11, 2017

(65) Prior Publication Data
US 2019/0161666 A1 May 30, 2019

(30) Foreign Application Priority Data

Nov. 5, 2015 (JP) ............................. JP2015-217951

(51) Int. Cl.
C08K 9/06 (2006.01)
C09K 5/14 (2006.01)
H01L 23/36 (2006.01)
C08L 83/04 (2006.01)
H01L 23/373 (2006.01)
C08J 3/20 (2006.01)
C08K 9/08 (2006.01)
C08G 77/20 (2006.01)
C08K 3/22 (2006.01)
C09C 3/12 (2006.01)

(52) U.S. Cl.
CPC ............... C09K 5/14 (2013.01); C08G 77/20 (2013.01); C08J 3/20 (2013.01); C08K 3/22 (2013.01); C08K 9/06 (2013.01); C08K 9/08 (2013.01); C08L 83/04 (2013.01); H01L 23/36 (2013.01); H01L 23/373 (2013.01); C08K 2003/2227 (2013.01); C08K 2201/001 (2013.01); C09C 3/12 (2013.01)

(58) Field of Classification Search
CPC ......... C08L 83/04; C09C 3/12; C08K 3/2227; C08K 2003/2227; C08K 9/06
See application file for complete search history.

(56) References Cited

U.S. PATENT DOCUMENTS

| | | |
|---|---|---|
| 5,021,494 A | 6/1991 | Toya |
| 6,114,429 A | 9/2000 | Yamada et al. |
| 6,169,142 B1 | 1/2001 | Nakano et al. |
| 6,306,957 B1 | 10/2001 | Nakano et al. |
| 7,141,273 B2 | 11/2006 | Endo et al. |
| 7,279,224 B2 | 10/2007 | Aoki et al. |
| 7,692,032 B2 | 4/2010 | Hoshino |
| 8,802,763 B2 | 8/2014 | Yamada et al. |
| 10,683,444 B2 | 6/2020 | Takanashi et al. |
| 10,808,154 B2 | 10/2020 | Gubbles et al. |
| 2002/0022127 A1 | 2/2002 | Katsuda et al. |
| 2003/0229174 A1 | 12/2003 | Goto et al. |
| 2005/0049357 A1* | 3/2005 | Zhong ................ C08L 83/04 524/588 |
| 2007/0185259 A1* | 8/2007 | Hoshino ............. C08L 83/04 524/588 |
| 2010/0048435 A1 | 2/2010 | Yamagata et al. |
| 2010/0140538 A1 | 6/2010 | Sekiba |
| 2011/0009544 A1 | 1/2011 | Funahashi |
| 2016/0152794 A1* | 6/2016 | Diaham ................ C08K 3/34 428/220 |
| 2017/0081578 A1 | 3/2017 | Kato et al. |
| 2020/0123327 A1 | 4/2020 | Sakurai et al. |
| 2020/0140736 A1 | 5/2020 | Takenaka et al. |

FOREIGN PATENT DOCUMENTS

| | | |
|---|---|---|
| CN | 1860181 A | 11/2006 |
| CN | 101641412 A | 2/2010 |
| EP | 3299420 A1 | 3/2018 |
| EP | 3575365 A1 | 12/2019 |
| JP | S62225533 A | 10/1987 |
| JP | 02097559 A | 4/1990 |

(Continued)

OTHER PUBLICATIONS

International Search Report (ISR) dated Jan. 31, 2017 issued in International Application No. PCT/JP2016/082627.
Written Opinion dated Jan. 31, 2017 issued in International Application No. PCT/JP2016/082627.
U.S. Appl. No. 16/319,624, filed Jan. 22, 2019, First Named Inventor: Eiji Tanigawa, Title: "Surface Treatment Agent for Thermally Conductive Polyorganosiloxane Composition".
International Search Report (ISR) dated Sep. 12, 2017 issued in International Application No. PCT/JP2017/026218.
Extended European Search Report (EESR) dated Mar. 6, 2020 issued in European Application No. 17831081.9.
Japanese Office Action (and English language translation thereof) dated Feb. 24, 2021 issued in Japanese Application No. 2018-100426.
Chinese Office Action (and partial English language translation thereof) dated Jan. 20, 2021 issued in Chinese Application No. 201780038857.4.

(Continued)

Primary Examiner — Margaret G Moore
(74) Attorney, Agent, or Firm — Holtz, Holtz & Volek PC

(57) ABSTRACT

A method for producing a polyorganosiloxane resin composition including: (a) mixing a thermally-conductive filler having a particle size distribution having a single peak, with a surface treatment agent containing a siloxane to form a mixture, and (b) mixing the mixture from step (a) with a polysiloxane resin.

5 Claims, No Drawings

(56) References Cited

FOREIGN PATENT DOCUMENTS

| | | | |
|---|---|---|---|
| JP | H06209057 A | 7/1994 | |
| JP | 08208993 A | 8/1996 | |
| JP | H11199672 A | 7/1999 | |
| JP | 2000001616 A | 1/2000 | |
| JP | 2000095896 A | 4/2000 | |
| JP | 2000256558 A | 9/2000 | |
| JP | 2001158609 A | 6/2001 | |
| JP | 2001158610 A | 6/2001 | |
| JP | 2001189407 A | 7/2001 | |
| JP | 2002003831 A | 1/2002 | |
| JP | 2002047009 A | 2/2002 | |
| JP | 2002299533 A | 10/2002 | |
| JP | 2003213133 A | 7/2003 | |
| JP | 2004010880 A | 1/2004 | |
| JP | 2005023246 A | 1/2005 | |
| JP | 2005162975 A | 6/2005 | |
| JP | 2006143978 A | 6/2006 | |
| JP | 2007119588 A | 5/2007 | |
| JP | 2008150439 A | 7/2008 | |
| JP | 2008156578 A | 7/2008 | |
| JP | 2008266449 A | 11/2008 | |
| JP | 2008280395 A | 11/2008 | |
| JP | 2009096961 A | 5/2009 | |
| JP | 2009203373 A | 9/2009 | |
| JP | 2010006923 A | 1/2010 | |
| JP | 2010150321 A | 7/2010 | |
| JP | 2013147600 A | 8/2013 | |
| JP | 2013234237 A | 11/2013 | |
| JP | 2014234506 A | 12/2014 | |
| JP | 2015013927 A | 1/2015 | |
| JP | 2015071662 A | 4/2015 | |
| WO | 2005030874 A1 | 4/2005 | |
| WO | 2008047809 A1 | 4/2008 | |
| WO | 2009136508 A1 | 11/2009 | |
| WO | 2015/004115 | * | 1/2015 |
| WO | 2016190188 A1 | 12/2016 | |
| WO | 2016190189 A1 | 12/2016 | |
| WO | 2017115679 A1 | 7/2017 | |
| WO | 2018016565 A1 | 1/2018 | |

OTHER PUBLICATIONS

Extended European Search Report (EESR) dated Feb. 10, 2021 issued in European Application No. 18808875.1.
International Search Report (ISR) dated Jul. 3, 2018 (and English translation thereof), issued in International Application No. PCT/JP2018/020905.
International Search Report (ISR) dated Oct. 10, 2017 issued in International Application No. PCT/JP2017/026219.
Office Action (Non-Final Rejection) dated Feb. 26, 2021 issued in related U.S. Appl. No. 16/618,083.
Office Action (Non-Final Rejection) dated Mar. 1, 2021 issued in related U.S. Appl. No. 16/319,624.
Related U.S. Appl. No. 16/319,639, First Named Inventor: Daigo Hirakawa; Title: "Thermally Conductive Polysiloxane Composition"; filed Jan. 22, 2019.
Related U.S. Appl. No. 16/618,083, First Named Inventor: Kenji Takenaka; Title: "Thermally Conductive Polysiloxane Composition"; filed Nov. 27, 2019.
Written Opinion dated Oct. 10, 2017 issued in International Application No. PCT/JP2017/026219.
Written Opinion of the International Searching Authority dated Jul. 3, 2018 issued in International Application No. PCT/JP2018/020905.
Korean Office Action (and English language translation thereof) dated May 12, 2021 issued in Korean Application No. 10-2019-7005321.
Chinese Office Action (and English language translation thereof) dated Jun. 8, 2021, issued in Chinese Application No. 201880036368.X.
Edited by Wang, "Green Chemical Additives", Jan. 2006.
Edited by Wang, "Production and Application of Epoxy Resins", Jun. 2001.
Zhou, et al., "Thermally Conductive Polymer Materials", Apr. 2014.

* cited by examiner

METHOD FOR PRODUCING A THERMALLY CONDUCTIVE POLYSILOXANE COMPOSITION

FIELD OF THE INVENTION

The present invention relates to a method for producing a thermally conductive polysiloxane composition.

BACKGROUND ART

In electronic parts, such as a power transistor, an IC, and a CPU, for preventing accumulation of heat caused due to electrical heating elements, a thermally conductive grease and a thermally conductive sheet having high thermal conductivity are used. The thermally conductive grease has an advantage in that it can be applied with ease to electronic parts irrespective of the shapes of the electronic parts, but has problems, for example, in that the grease stains or breaks other parts and in that an oil component oozes out of the grease. The thermally conductive sheet does not stain or break other parts or cause an oil component to ooze; however, the sheet has poorer adhesion than the grease, and therefore, in order to improve the adhesion of the thermally conductive sheet, a method of reducing the hardness of the sheet is employed.

Silicone rubbers are widely used in the thermally conductive sheet. Silicone cannot enhance the thermal conductivity by itself and therefore, for improving the silicone rubber in thermal conductivity, a thermally conductive filler and the silicone rubber are used in combination. It has been known that, as a thermally conductive filler, a material having higher thermal conductivity than that of a silicone as a binder, such as a silica powder, alumina, boron nitride, aluminum nitride, or magnesium oxide, can be added (JP2002-003831A). For obtaining a silicone composition having higher thermal conductivity, it is necessary to more highly fill the composition with a thermally conductive filler, but the filling property of the filler has a limitation, and therefore a filler which has been subjected to surface treatment is used (WO2005/030874 A1).

As a production method for obtaining the above-mentioned silicone composition, various methods having a surface treatment for a filler have been known (see, for example, JP2005-023246A), and there have been employed a method called an integral blend method, in which all the components are mixed together at a time to obtain a resin composition (JP2001-189407A), and a solvent substitution method in which a filler is dispersed in a solution having a surface treatment agent dispersed in a solvent so as to uniformly subject the filler to surface treatment, and then the solvent is removed (JP2010-150321A).

PRIOR ART REFERENCES

Patent Documents

Patent document 1: JP2002-003831A
Patent document 2: WO2005/030874 A1
Patent document 3: JP2005-023246A
Patent document 4: JP2001-189407A
Patent document 5: JP2010-150321A

SUMMARY OF THE INVENTION

Problems to be Solved by the Invention

In the integral blend method, however, the silicone resin, filler, and surface treatment agent are mixed together at a time, and therefore the surface treatment agent in an excess amount is needed. In the composition obtained after being mixed, an alkoxy group derived from the surface treatment agent remains, causing the composition to be disadvantageous in, for example, a heat resistance. Further, the solvent substitution method has a complicated production process. Moreover, studies made by the present inventors have clearly shown that the conventionally known integral blend method has a disadvantage in that a filler is likely to suffer aggregation, especially when the filler has a narrow particle size distribution, so that this method cannot be applied to such a filler.

Accordingly, an object of the present invention is to solve the above-mentioned problems accompanying the prior art techniques, and to provide a method which can reduce the amount of the surface treatment agent used, and which enables a surface treatment for a filler through a simple step. In addition, another object of the present invention is to provide a method for producing a thermally conductive silicone composition, which method can be applied to a filler having a monomodal particle size distribution.

Means for Solving the Problems

The present inventors have conducted extensive and intensive studies with a view toward achieving the above-mentioned object. As a result, it has been found that, by directly treating a filler with a specific alkoxysiloxane as a surface treatment agent, the amount of the modifier used can be reduced in a simple method and a composition having a reduced viscosity can be produced, and the present invention has been completed.

Specifically, the present invention is directed to the inventions according to the following items.

[1] A method for producing a polyorganosiloxane resin composition, wherein the method comprises:

the step (a1) of mixing a thermally conductive filler having a particle size distribution having a single peak, and a surface treatment agent containing a siloxane with each other, and the step (b) of mixing the mixture of the thermally conductive filler and the surface treatment agent obtained in the step (a1) with a polysiloxane resin, wherein the surface treatment agent comprises a siloxane compound represented by the following general formula (1):

[Chemical formula 1]

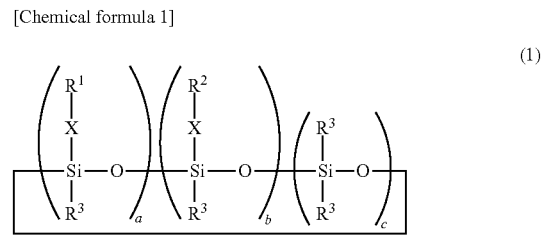

wherein:
$R^1$: is a group having an alkoxysilyl group having 1 to 4 carbon atoms,
$R^2$: is a siloxane represented by the following general formula (2):

[Chemical formula 2]

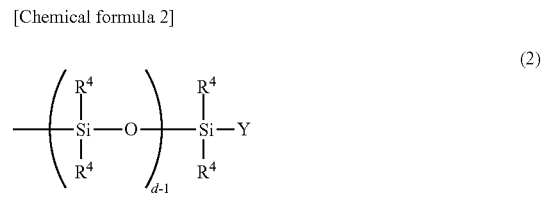

wherein $R^4$ each independently is a monovalent hydrocarbon group having 1 to 12 carbon atoms, Y is a group selected from the group consisting of $R^1$, $R^4$, and an aliphatic unsaturated group, and d is an integer of 2 to 500 or a monovalent hydrocarbon group having 6 to 18 carbon atoms, X: each independently is a divalent hydrocarbon group having 2 to 10 carbon atoms, a and b: each independently is an integer of 1 or more, c: is an integer of 0 or more, a+b+c: is an integer of 4 or more, and $R^3$: each independently is a monovalent hydrocarbon group having 1 to 6 carbon atoms or a hydrogen atom.

[2] The method according to item [1] above, wherein the amount of the surface treatment agent is in the range of from 0.1 to 10 parts by mass, relative to 100 parts by mass of the thermally conductive filler.

[3] The method according to item [1] or [2] above, wherein the surface treatment agent is dissolved in a solvent, wherein the amount of the surface treatment agent is 20% by mass or more, based on the total mass of the solvent and the surface treatment agent (100% by mass).

[4] The method according to item [3] above, which further comprises, subsequent to the step (a1) and prior to the step (b), the step of stirring the mixture of the thermally conductive filler and the surface treatment agent obtained in the step (a1) at a temperature equal to or higher than the boiling point of the solvent dissolving the surface treatment agent.

[5] The method according to any one of items [1] to [4] above, wherein the thermally conductive filler is selected from the group consisting of alumina, zinc oxide, magnesium oxide, boron nitride, aluminum nitride, a silica powder, silicon carbide, a metal powder, diamond, aluminum hydroxide, carbon, and a mixture thereof.

[6] A method for producing a polyorganosiloxane resin composition, wherein the method comprises:

the step (a1) of mixing a first thermally conductive filler and a first surface treatment agent containing a siloxane with each other, the step (a2) of mixing a second thermally conductive filler and a second surface treatment agent containing a siloxane with each other, and the step (b') of mixing the mixture of the thermally conductive filler and the surface treatment agent obtained in the step (a1) and the mixture of the thermally conductive filler and the surface treatment agent obtained in the step (a2) with a polysiloxane resin, wherein both the first thermally conductive filler and the second thermally conductive filler have a monomodal particle size distribution, wherein the first thermally conductive filler and the second thermally conductive filler have different average particle diameters, wherein the first surface treatment agent and the second surface treatment agent comprise the same or different siloxane compound or compounds represented by the formula (1) in the item [1] above.

Effects of the Invention

In the present invention, there is provided a method for producing a thermally conductive polysiloxane composition, which is advantageous not only in that the method is simple and can reduce the amount of the modifier used and produce a composition having a reduced viscosity, but also in that the method can be applied to a monodispersed filler.

MODE FOR CARRYING OUT THE INVENTION

The method of the present invention is a method for producing a polysiloxane composition having a thermally conductive filler incorporated, which comprises the step (a1) of mixing a thermally conductive filler having a particle size distribution having a single peak, and a surface treatment agent containing a siloxane with each other, and the step (b) of mixing the mixture of the thermally conductive filler and the surface treatment agent obtained in the above step (a1) with a polysiloxane resin. Hereinbelow, the various components and specific techniques and others used in the method of the present invention will be described in detail.

[Siloxane Compound]

In the thermally conductive polysiloxane composition obtained by the method of the present invention, as a surface treatment agent, a siloxane compound represented by the following general formula (1):

[Chemical formula 3]

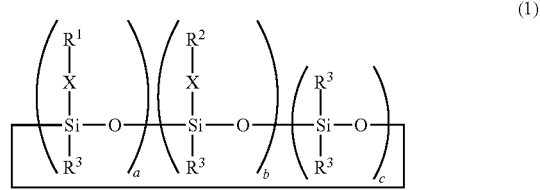

wherein $R^1$, $R^2$, $R^3$, X, a, b, and c are as defined above is used.

When a siloxane having the cyclic structure represented by the general formula (1) is used, an increased number of hydrolyzable groups can be introduced to the cyclic structure, and further positions of these groups are concentrated, and therefore it is expected that the treatment efficiency for the thermally conductive filler is increased, enabling higher filling. Further, such a siloxane has an advantage in that it can be easily obtained by, for example, subjecting to addition reaction a cyclic siloxane containing a hydrogen group directly bonded to silicon, a siloxane having an unsaturated group at one end thereof, and a silane compound containing an unsaturated group and a hydrolyzable group.

In the general formula (1), $R^1$ is a hydrolyzable functional group containing an alkoxysilyl group having 1 to 4 carbon atoms, and, as more specific examples, there can be mentioned those having the structures shown below. $R^1$ may be directly bonded to X with silicon, but may be bonded to X through a linking group, such as an ester linkage.

[Chemical formula 4]

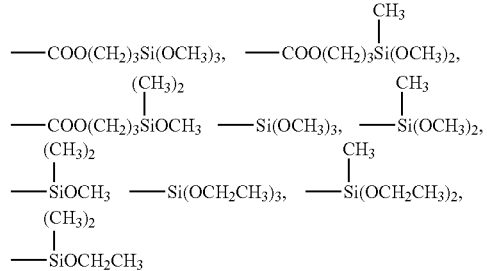

Especially, in view of a tendency toward a further improvement of the treatment efficiency for the thermally conductive filler, $R^1$ is preferably a group of a structure having two or more alkoxysilyl groups, especially having three alkoxysilyl groups. Further, in view of easy availability of the raw material, $R^1$ preferably contains a methoxysilyl group.

$R^2$ is selected from a group consisting of an oligosiloxane and long-chain alkyl. When $R^2$ is a long-chain alkyl group, the number of carbon atoms of the group is in the range of from 6 to 18, preferably 6 to 14. The term "long-chain alkyl group" means an alkyl group, of which the longest carbon chain portion has 6 or more carbon atoms, and which may have a branched structure as long as the total number of carbon atoms of the alkyl group is in the range of from 6 to 18. When the number of carbon atoms of the alkyl group is in this range, the effect on the fluidity is improved, enabling high incorporation. Further, the handling properties of the compound are excellent, making it easy to uniformly disperse the compound.

When $R^2$ is an oligosiloxane, $R^2$ is a group represented by the following general formula (2):

[Chemical formula 5]

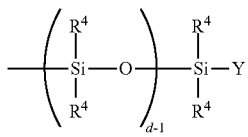
(2)

wherein $R^4$, Y, and d are as defined above.

In the general formula (2), d is a number in the range of from 2 to 500, preferably in the range of from 4 to 400, more preferably in the range of from 10 to 100, further preferably in the range of from 10 to 40, especially preferably in the range of from 20 to 30. When d is in this range, the effect on the fluidity is improved, enabling high incorporation. Further, the viscosity of the siloxane compound itself can be reduced. $R^4$ each independently is a monovalent hydrocarbon group having 1 to 12 carbon atoms, and examples of $R^4$'s include linear or branched $C_{1-12}$ alkyl groups, and aryl groups, such as phenyl and naphthyl. $R^4$ may be substituted with a halogen, such as chlorine, fluorine, or bromine, and examples of such groups include perfluoroalkyl groups, such as a trifluoromethyl group. In view of easy synthesis of the compound, $R^4$ is preferably a methyl group. Y is a group selected from the group consisting of $R^1$, $R^4$, and an aliphatic unsaturated group. When Y is $R^4$, the number of carbon atoms of $R^4$ is preferably in the range of from 1 to 6. When Y is an aliphatic unsaturated group, the number of carbon atoms of the aliphatic unsaturated group is preferably 2 to 10, more preferably 2 to 6. Further, the aliphatic unsaturated group preferably has a double bond at an end for facilitating the occurrence of a curing reaction. In view of easy synthesis of the compound, Y is preferably a methyl group or a vinyl group.

$R^1$ and $R^2$ are individually bonded through group X to the cyclic siloxane portion of the siloxane represented by the general formula (1). Group X is a divalent hydrocarbon group having 2 to 10 carbon atoms, and examples of such groups include alkylene groups, such as —$CH_2CH_2$—, —$CH_2CH_2CH_2$—, —$CH_2CH_2CH_2CH_2CH_2CH_2$—, —$CH_2CH(CH_3)$—, and —$CH_2CH(CH_3)CH_2$—. In view of easy synthesis of the compound, X is preferably —$CH_2CH_2$— or —$CH_2CH(CH_3)$—.

$R^3$ each independently is a monovalent hydrocarbon group having 1 to 6 carbon atoms or a hydrogen atom. $R^3$'s may be the same or different, but, in view of easy synthesis of the compound, each $R^3$ is preferably a methyl group or a hydrogen atom.

a and b are an integer of 1 or more, preferably 1 to 2. a is more preferably 1. b is preferably 1 or 2, but the value of b as well as the value of d are more preferably designed so that the number of —$SiR^4_2O$— units contained in the general formula (1) above falls in the range of from 20 to 60. c is an integer of 0 or more, preferably 0 to 1. Further, the total of a+b+c is an integer of 4 or more, and is preferably 4 in view of easy synthesis of the compound.

As representative examples of the above-described siloxane compounds, there can be mentioned the compounds shown below, but the siloxane compound in the present invention is not limited to these compounds.

[Chemical formula 6]

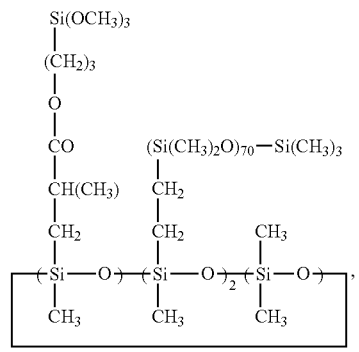

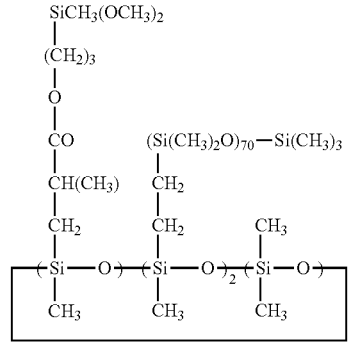

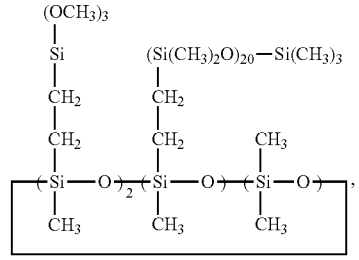

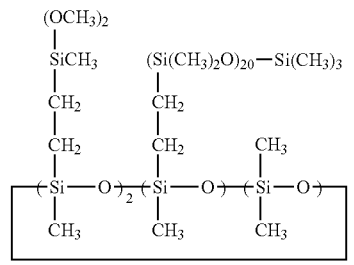

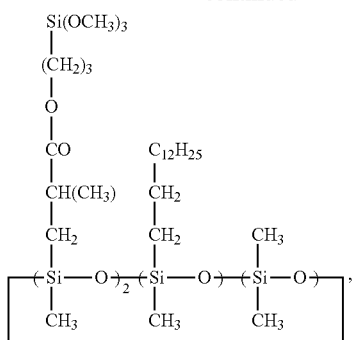
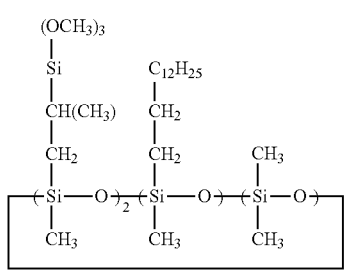
As further representative examples of the siloxane compounds, there can be mentioned compounds represented by the structural formulae shown below, but the siloxane compound in the present invention is not limited to these compounds.
[Chemical formula 7]
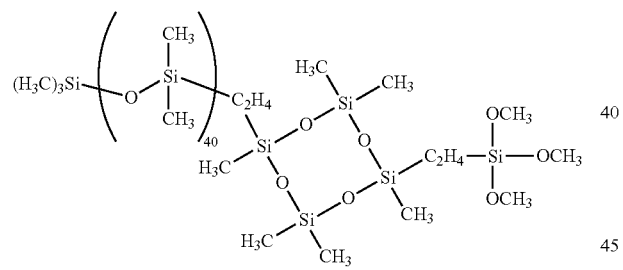
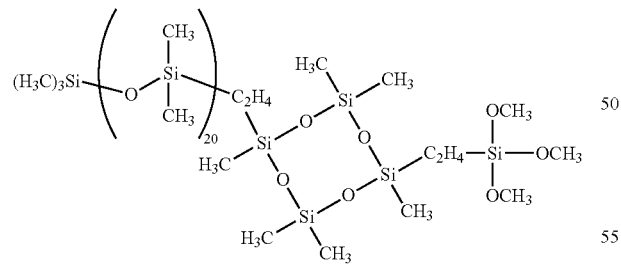
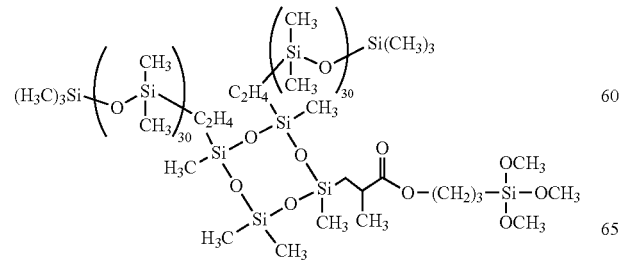
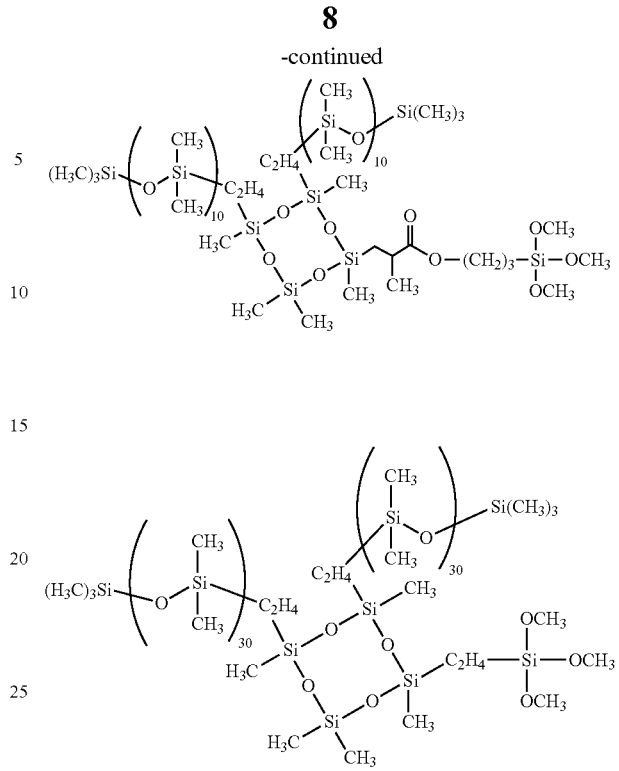
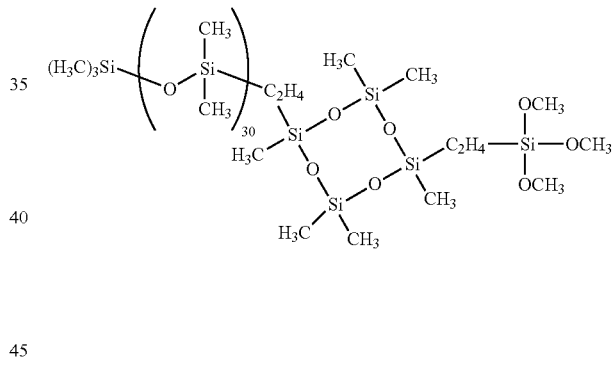
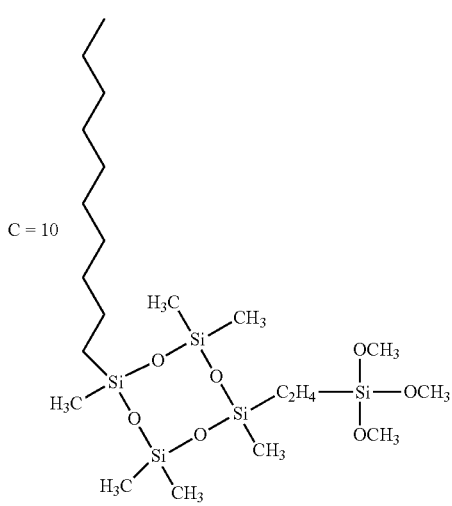

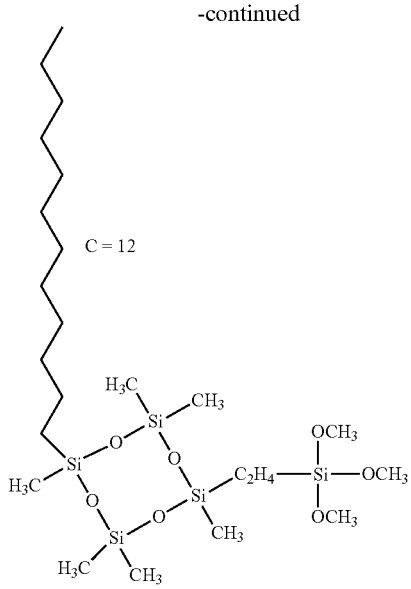

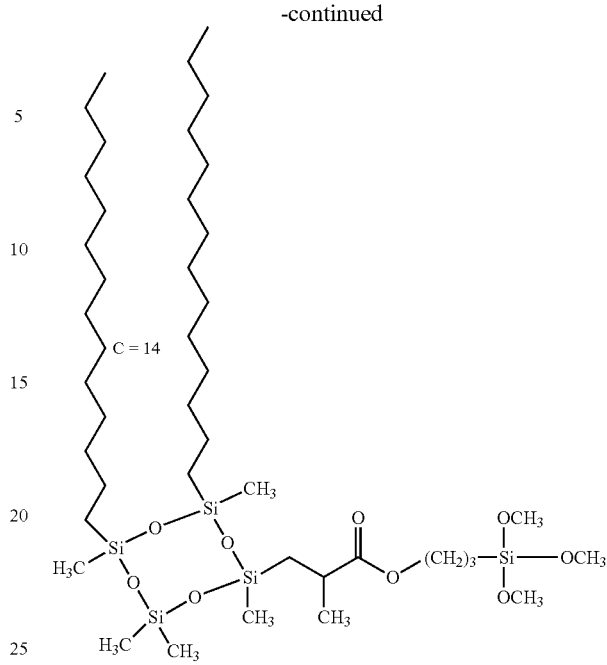

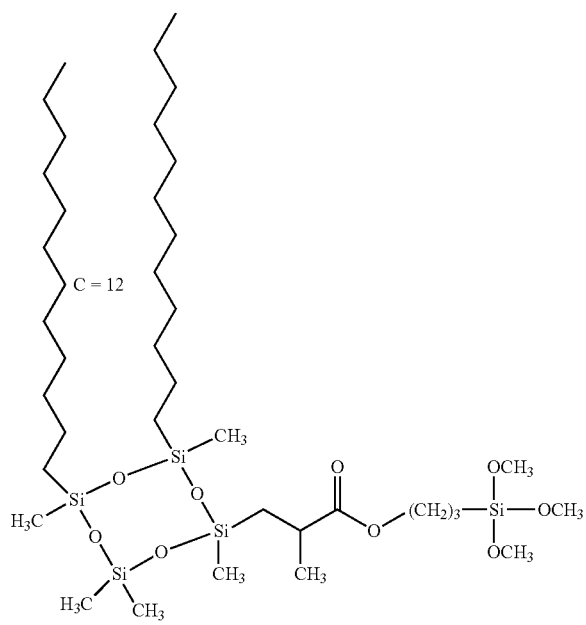

The siloxane compound used in the present invention can be prepared using a method known to those skilled in the art or a similar method. A siloxane of the structure represented by the general formula (1) can be obtained by an example of the method in which a cyclic siloxane having two or more Si—H bonds and an alkoxysilane having an unsaturated bond, such as vinyltrimethoxysilane, are reacted with each other, and then the resultant product is reacted with a linear polysiloxane having an unsaturated bond. The reaction conditions, purification method and others can be appropriately selected by those skilled in the art.

The amount of the incorporated siloxane compound represented by the general formula (1) is preferably in the range of from 0.1 to 10 parts by mass, relative to 100 parts by mass of the thermally conductive filler. When the amount of the siloxane compound is in this range, not only can the amount of the surface treatment agent used be reduced while increasing the filling property of the thermally conductive filler, but also the thermal conductivity can be increased. The amount of the siloxane compound incorporated is more preferably in the range of from 0.5 to 5.0 parts by mass. With respect to the amount of the siloxane compound relative to the polysiloxane resin having a curable functional group, 1 part by mass or more of the siloxane compound represented by the general formula (1) is preferably used, relative to 100 parts by mass of the polysiloxane resin having a curable functional group. When the amount of the siloxane compound relative to the polysiloxane resin is less than 1 part by mass, the surface treatment effect for the thermally conductive filler is reduced, making high incorporation difficult. When the amount of the siloxane compound is too large, the physical properties of the composition after cured are adversely affected, and therefore the amount of the siloxane compound is more preferably in the range of from 5 to 500 parts by mass.

[Thermally Conductive Filler]

Examples of thermally conductive fillers include generally known inorganic fillers, such as alumina, magnesium oxide, zinc oxide, boron nitride, aluminum nitride, a silica powder, silicon carbide, a metal powder, diamond, aluminum hydroxide, and carbon. Especially preferred is alumina, zinc oxide, aluminum nitride, or silicon carbide. With respect to the above inorganic fillers, those which are commercially available can be used.

The thermally conductive filler of any type can be used as long as it has an average particle diameter of 0.1 μm or more, but the thermally conductive filler having an average particle diameter of 300 μm or less is preferably used. With respect to the thermally conductive filler having an average particle diameter in this range, when the thermally conductive filler having a larger average particle diameter is incorporated, the filling ratio cannot be increased. On the other hand, when the thermally conductive filler having a smaller average particle diameter is incorporated, the resultant composition is likely to be increased in viscosity, and, by incorporating the thermally conductive filler having an appropriately selected average particle diameter, a composition having a viscosity suitable for the purpose can be obtained. The average particle diameter can be determined as, for example, a weight average value (or a median diameter) using a particle size distribution measurement apparatus by, for example, a laser light diffraction method.

The thermally conductive filler, of which the particle size distribution has only a single peak, i.e., the thermally conductive filler having a monomodal particle size distribution is used. When the particles of the thermally conductive filler have a monomodal particle size distribution, the peak of the particle size distribution of the thermally conductive filler has the same meaning as the average particle diameter of the thermally conductive filler. It is considered that when a filler having a large degree of dispersion is used, the proportion of the particles having a smaller particle diameter, which suffer aggregation due to the surface treatment, to the all particles of the filler is increased, adversely affecting the filling property.

The amount of the filler incorporated into the thermally conductive polysiloxane resin is in the range of from 10 to 3,500 parts by mass, relative to 100 parts by mass of the total of the siloxane compound and the polysiloxane resin having a curable functional group. Especially when the amount of the filler incorporated is in the range of from 100 to 3,000 parts by mass, the effects of the present invention are markedly exhibited.

[Polysiloxane Resin]

In the thermally conductive polysiloxane composition in the present invention, a polysiloxane resin having a curable functional group is used. In the present specification, the term "curable functional group" means a functional group which is capable of taking part in a curing reaction of a resin. Examples of curable functional groups include a vinyl group, (a)an (meth)acryl group, and a hydrogen group directly bonded to silicon.

As an example of the polysiloxane resin having a curable functional group, there can be mentioned a linear polyorganosiloxane containing an aliphatic unsaturated group and being represented by the following formula (3):

[Chemical formula 8]

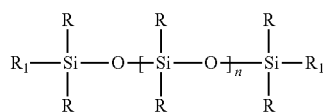

(3)

wherein:
$R_1$ each independently is an aliphatic unsaturated group,
R each independently is a $C_{1-6}$ alkyl group or a $C_{1-12}$ aryl group, and
n is a number that satisfies the viscosity of 10 to 10,000 cP at 23° C., but the polysiloxane resin is not limited to the resin having the above structure.

From the viewpoint of the productivity and working properties, an addition-reaction curing polyorganosiloxane is preferably contained as the polysiloxane resin. With respect to the addition-reaction curing polyorganosiloxane, there has been known one which comprises (a) an unsaturated group-containing polyorganosiloxane which is a base polymer, (b) a polyorganosiloxane containing a hydrogen group directly bonded to silicon, which is a crosslinking agent, and (c) a platinum compound which is a curing catalyst.

With respect to the unsaturated group-containing polyorganosiloxane as component (a), in the organic group bonded to a silicon atom per molecule, at least 0.5 or more unsaturated groups on average are preferably contained. When the number of unsaturated groups per molecule is less than 0.5, the component which does not take part in crosslinking is increased, so that a satisfactory cured product cannot be obtained. When the number of unsaturated groups per molecule is 0.5 or more, a cured product can be obtained basically, but, when the number of unsaturated groups per molecule is too large, the resultant cured product is poor in heat resistance, so that the intended object cannot be achieved. Therefore, the number of unsaturated groups per molecule is preferably in the range of from 0.5 to 2.0. The unsaturated group is preferably a vinyl group from the viewpoint of facilitating preparation of a polyorganosiloxane. The unsaturated group may be bonded to any position of an end of the molecular chain and a side end of the molecular chain, but, from the viewpoint of increasing the curing rate and achieving high heat resistance of the cured product, the unsaturated group is preferably bonded to an end of the molecular chain.

As examples of other functional groups in the unsaturated group-containing polyorganosiloxane, there can be mentioned monovalent substituted or unsubstituted hydrocarbon groups, for example, alkyl groups, such as methyl, ethyl, propyl, butyl, hexyl, and dodecyl; aryl groups, such as phenyl; aralkyl groups, such as 2-phenylethyl and 2-phenylpropyl; and substituted hydrocarbon groups, such as chloromethyl and 3,3,3-trifluoropropyl. A methyl group and a phenyl group are preferred in view of easy synthesis of the polyorganosiloxane.

The structure of the unsaturated group-containing polyorganosiloxane may be either linear or branched. With respect to the viscosity of the unsaturated group-containing polyorganosiloxane, there is no particular limitation, but the viscosity at 23° C. is preferably 0.01 to 50 Pa*s.

Generally, an unsaturated group-containing polyorganosiloxane is obtained by subjecting a cyclic siloxane, such as hexamethylcyclotrisiloxane, octamethylcyclotetrasiloxane, or tetravinyltetramethylcyclotetrasiloxane, and an organosiloxane having $R_3SiO_{0.5}$ (wherein R is a monovalent hydrocarbon group) units to equilibrated polymerization in the presence of an appropriate catalyst, such as an alkali or an acid, and then subjecting the resultant product to neutralization step and removing the excess low molecular-weight siloxane component.

The hydrogen group-containing polyorganosiloxane as component (b) is a siloxane compound having a hydrogen atom directly bonded to a silicon atom, which is a component that serves as a crosslinking agent. The amount of the incorporated component (b) is an amount such that the number of hydrogen atoms directly bonded to a silicon atom becomes 0.2 to 5.0, relative to one unsaturated group of component (a). When the number of the hydrogen atoms is less than 0.2, curing does not satisfactorily proceed, and, when the number of the hydrogen atoms is more than 5.0, the resultant cured product becomes too hard, and further the physical properties of the composition after cured are likely to be adversely affected. It is necessary that the number of hydrogen groups bonded to a silicon atom contained per molecule be at least two or more, but, with respect to the other conditions, organic groups other than a hydrogen group, bonding position, polymerization degree, structure and others, there is no particular limitation, and two types or more of hydrogen group-containing polyorganosiloxanes may be used.

The hydrogen group-containing polyorganosiloxane representatively has in the molecule thereof two or more units represented by the following general formula (4):

$$(R^b)_x(R^c)_y SiO_{(4-x-y)/2} \quad (4)$$

wherein:
$R^b$ is a hydrogen atom;
$R^c$ is a $C_{1-6}$ alkyl group (e.g., methyl, ethyl, propyl, butyl, pentyl, or hexyl, preferably methyl) or a phenyl group;
x is 1 or 2; and
y is an integer of 0 to 2, with the proviso that x+y is 1 to 3.

Examples of siloxane skeletons in the hydrogen group-containing polyorganosiloxane include those which are cyclic, branched, or linear, and preferred is a cyclic or branched skeleton.

The platinum compound as component (c) is a curing catalyst used for reacting an unsaturated group of component (a) with a hydrogen group directly bonded to a silicon atom of component (b) to obtain a cured product. Examples of the platinum compounds include chloroplatinic acid, a platinum-olefin complex, a platinum-vinylsiloxane complex, a platinum-phosphorus complex, a platinum-alcohol complex, and platinum black. The amount of the platinum compound incorporated is 0.1 to 1,000 ppm, in terms of a platinum element, based on the unsaturated group-containing polyorganosiloxane as component (a). When the amount of the platinum compound is less than 0.1 ppm, curing does not satisfactorily proceed, and, even when the amount of the platinum compound is more than 1,000 ppm, an improvement of the curing rate cannot particularly be expected. For obtaining a longer pot life, the activity of the catalyst can be suppressed by adding a reaction inhibitor. Examples of known reaction inhibitors for metals of the platinum group include acetylenic alcohols, such as 2-methyl-3-butyn-2-ol and 1-ethynyl-2-cyclohexanol.

[Method for Producing a Polyorganosiloxane Resin Composition]

The method for producing a polyorganosiloxane resin composition of the present invention comprises, as step (a1), the step of mixing a thermally conductive filler having a particle size distribution having a single peak, and a surface treatment agent containing a siloxane with each other.

Step (a1) can be performed by, for example, directly adding a surface treatment agent to a thermally conductive filler in a powdery form and mixing them with each other. In the mixing, a known kneading apparatus, such as SUPERMIXER (SM Series), manufactured by Kawata Mfg. Co., Ltd., can be used. With respect to the treatment temperature in step (a1), there is no particular limitation as long as the temperature is in such a range that the surface treatment agent or thermally conductive filler does not suffer, for example, modification or decomposition. A preferred treatment temperature is in the range of from room temperature to 200° C. for the reason of, for example, operating properties or safety. During the mixing, for example, friction in the thermally conductive filler being mixed can cause heat generation. Therefore, using frictional heat, the treatment temperature can be in the range of from 60 to 90° C., and, when the heat generation is unsatisfactory, if necessary, the mixture can be heated to up to 200° C. In addition, a known heating apparatus may be provided to achieve the intended temperature, and the temperature can be controlled using, for example, a constant temperature bath.

In step (a1), as a surface treatment agent, the siloxane compound represented by the general formula (1) above is used. With respect to the siloxane compound for surface treatment agent, only a single type of siloxane compound may be used, or a mixture of two or more types of the siloxane compounds may be used. The surface treatment agent may be used in the form of a solution obtained by appropriately dissolving the agent in a solvent. In such a case, the concentration of the surface treatment agent in the surface treatment agent solution is preferably 20% by mass or more for reducing both the amount of the surface treatment agent used and the amount of the solvent used. With respect to the solvent which dissolves the surface treatment agent, there is no particular limitation as long as it is a solvent which is capable of dissolving therein the surface treatment agent and which does not react with the surface treatment agent. Examples of solvents include alcohols, such as ethanol and isopropanol; hydrocarbons, such as hexane, heptane, toluene, and xylene; and ketones, such as acetone. The siloxane compound for surface treatment agent having a small viscosity may be used as a solvent.

When the surface treatment agent is used in the form of a solution, it is preferred that the method of the present invention further comprises, subsequent to step (a1) and prior to step (b), the drying step of stirring the mixture obtained in step (a1) at a temperature equal to or higher than the boiling point of the solvent dissolving the surface treatment agent. For achieving the above-mentioned temperature, the mixture may be heated using a stirrer provided with a known heating apparatus, or, for example, frictional heat in the thermally conductive filler caused by stirring may be utilized. Further, the temperature can be controlled using, for example, a constant temperature bath. With respect to the duration of the stirring, there is no particular limitation as long as the solvent can be removed, but, for completely removing the solvent while achieving uniform surface treatment, the stirring is preferably performed for 10 minutes to 1 hour, more preferably for 10 to 30 minutes.

A thermally conductive filler which is not treated with a surface treatment agent can be further added to the mixture obtained in step (a1). With respect to the thermally conductive filler further added, those which are described above can be preferably used. In the mixing, a known kneading apparatus, such as the above-mentioned SUPERMIXER (SM Series), manufactured by Kawata Mfg. Co., Ltd., can be used.

The method of the present invention comprises, as step (b), the step of mixing the mixture of the thermally conductive filler and the surface treatment agent obtained in the above step (a1) with a polysiloxane resin. The mixing in step (b) can be conducted under the same conditions as those for step (a1). Step (b) may be either performed in the same batch in a continuous manner subsequent to step (a1) or performed as an independent step after the mixture obtained in step (a1) is isolated.

The polysiloxane resin to be mixed in step (b) may be added as such without being diluted to the mixture obtained in step (a1). When the viscosity of the polysiloxane resin is high, the polysiloxane resin may be added in the form of a solution which is controlled in viscosity so that it is easy to handle. However, in the latter case, there is a need to further provide the step of removing the solvent, and there is a danger that heat generated during the removal of the solvent causes the polysiloxane resin to suffer curing or modification depending on the type of the resin. Therefore, it is preferred that the polysiloxane resin is added without using a solvent. Further, when the above-mentioned addition-reaction curing polyorganosiloxane is contained as the polysiloxane resin, a procedure can be performed in which a resin composition having incorporated the above-mentioned component (a) is previously prepared and, immediately before being cured, component (b) and component (c) are added to the resin composition.

In step (b), in addition to the polysiloxane resin, an additional surface treatment agent may be further added. By further adding the surface treatment agent, the resultant composition can be further reduced in viscosity, so that a resin composition having more excellent handling properties can be obtained. With respect to the additional surface treatment agent, a surface treatment agent of a type different from that used in step (a1) may be used, or a surface treatment agent of the same type as that used in step (a1) may be used. When an additional surface treatment agent is added in step (b), it is preferred that the total amount of the additional surface treatment agent added in step (b) and the surface treatment agent used in step (a1) is in the above-mentioned preferred range of the amount of the surface treatment agent, that is, in the range of from 0.1 to 10 parts by mass, particularly 0.5 to 5.0 parts by mass, relative to 100 parts by mass of the thermally conductive filler.

In the method of the present invention, an organopolysiloxane resin composition can be obtained by using a plurality of steps for subjecting two or more different types of thermally conductive fillers to surface treatment in combination. Specifically, the method of the present invention encompasses a method for producing a polyorganosiloxane resin composition, which comprises:

the step (a1) of mixing a first thermally conductive filler and a first surface treatment agent containing a siloxane with each other, the step (a2) of mixing a second thermally conductive filler and a second surface treatment agent containing a siloxane with each other, and the step (b') of mixing the mixture of the thermally conductive filler and the surface treatment agent obtained in the step (a1) and the mixture of the thermally conductive filler and the surface treatment agent obtained in the step (a2) with a polysiloxane resin, wherein both the first thermally conductive filler and the second thermally conductive filler have a monomodal particle size distribution, wherein the first thermally conductive filler and the second thermally conductive filler have different average particle diameters, wherein the first surface treatment agent and the second surface treatment agent comprise the same or different siloxane compound or compounds represented by the general formula (1) above. Hereinbelow, the mixtures of two types of thermally conductive fillers in steps (a1) and (a2) are described, but the description applies to mixtures containing three types or more of thermally conductive fillers.

The above-mentioned step (a2) is substantially the same step as step (a1) except that the thermally conductive filler used in step (a2) is different in average particle diameter from that used in step (a1). With respect to the second thermally conductive filler, a chemical species different from that of the first thermally conductive filler may be used.

The second thermally conductive filler is monodispersed particles, but has an average particle diameter different from that of the first thermally conductive filler. The respective average particle diameters of these thermally conductive fillers are preferably selected so that the particle size distribution of the resultant mixture of the thermally conductive fillers has at least two peaks separable from each other. For example, for further improving the filling property, the thermally conductive fillers are preferably selected so that one thermally conductive filler has a particle size distribution peak in the range of from 0.1 to 6.0 μm and another thermally conductive filler has a particle size distribution peak in the range of from 6.0 to 200 pmn. Further, in each of the range of from 0.1 to 6.0 μm and the range of from 6.0 to 200 μm, a combination of two or more average particle diameters may be present.

In step (b'), the at least two mixtures obtained in steps (a1) and (a2) are further mixed with a polysiloxane resin. The amount of the mixture of the second thermally conductive filler and the surface treatment agent used in this instance can be an arbitrary amount relative to the mixture of the first thermally conductive filler and the surface treatment agent, but is preferably an amount such that the particle size distribution of the resultant mixture of these mixtures can be confirmed to have at least two peaks separable from each other.

With respect to the types of the materials used and the conditions for the methods and others in the steps (a2) and (b'), those in the above-described embodiment can be used.

By the above-described method, a polyorganosiloxane resin composition having incorporated the thermally conductive fillers having at least two different particle size distributions obtained in steps (a1) and (a2) can be obtained. The polyorganosiloxane resin composition contains a plurality of types of fillers having different particle sizes, so that the polyorganosiloxane resin composition can exhibit a higher filling ratio.

In the thermally conductive polysiloxane composition in the present invention, if necessary, a pigment, a flame retardant, a tackifier, a heat resistance imparting agent, a diluent, an organic solvent and others, which have been known to those skilled in the art, can be appropriately incorporated in such an amount that the effects of the present invention are not sacrificed.

A silicone rubber can be obtained by curing the curable functional group of the thermally conductive polysiloxane composition in the present invention. A curing reaction of the polysiloxane composition can be conducted by a method appropriately selected according to the type of the curable functional group of the polysiloxane resin.

When using a polyorganosiloxane having, as a curable functional group, a functional group which causes a curing reaction due to heat, such as an epoxy group, the thermally conductive polysiloxane composition can be cured by applying heat to the composition. The conditions for heat curing are known to those skilled in the art, and, as examples of apparatuses which can be used in a curing reaction caused due to heat, there can be mentioned apparatuses known to those skilled in the art, such as a constant temperature bath.

The heating conditions can be appropriately selected according to the heat resistance temperature of a member to which the composition is applied, and the curing time can be determined. For example, heat at 40 to 100° C. can be applied to the composition for a period of time in the range of from 1 minute to 5 hours. The heating temperature is preferably 50 to 90° C. from the viewpoint of the operating properties, more preferably 60 to 80° C. The heating time is preferably 5 minutes to 3 hours from the viewpoint of facilitating the curing step, more preferably 10 minutes to 2 hours.

A silicone rubber obtained by curing the thermally conductive polysiloxane composition in the present invention can be used as a radiator member for electronic devices and electronic parts, such as an integrated circuit element.

EXAMPLES

Hereinbelow, the present invention will be described with reference to the following Examples, which should not be construed as limiting the scope of the present invention. In the following Examples and Comparative Examples, the "part(s)" indicates part(s) by mass.

The materials used in the following Examples and Comparative Examples are as shown below.

<Siloxane Compound Represented by General Formula (1)>
A-1: Siloxane compound represented by the following formula; viscosity: 180 cP

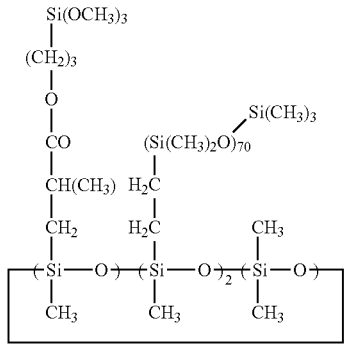

A-2: Siloxane compound represented by the following formula; viscosity: 60 cP

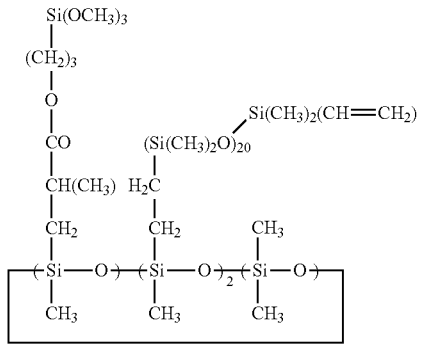

A-3: α,ω-Bis(trimethoxysilyl)polydimethylsiloxane; viscosity: 100 cP
<Polyorganosiloxane Resin>
B-1: α,ω-Divinylpolydimethylsiloxane; viscosity: 350 cP
<Alumina>
F-1: Alumina AL160SG-4; average particle diameter: 0.55 μm; indefinite shape; monodispersed; manufactured by Showa Denko K.K.
F-2: Sumicorundum AA-04; average particle diameter: 0.4 μm; rounded shape; monodispersed; manufactured by Sumitomo Chemical Co., Ltd.
F-3: Sumicorundum AA-3; average particle diameter: 3 μm; rounded shape; monodispersed; manufactured by Sumitomo Chemical Co., Ltd.
F-4: Alumina beads CB A-20S; average particle diameter: 20 μm; spherical shape; monodispersed; manufactured by Showa Denko K.K.
F-5: Alumina AS-40; average particle diameter: 12 μm; rounded shape; multidispersed; manufactured by Showa Denko K.K.

[Conditions for Evaluation of Physical Properties]
(1) Viscosity of a Composition Using a rotational viscometer (Vismetron VDH)(manufactured by Shibaura System Co., Ltd.) and using a No. 7 rotor, a viscosity at 23° C. was measured at 10 rpm for one minute (viscometer A-1). With respect to the composition which has such a high viscosity that satisfactory measurement of the viscosity cannot be made under the above conditions, a viscosity was measured by means of a Brookfield type viscometer (Model B8U/50)(manufactured by Tokimec Inc.). A viscosity at 23° C. was measured under conditions for measurement using a No. 7 rotor at 10 rpm for one minute (viscometer A-2).

(2) Dispersibility of a Composition

With respect to the sample prepared in each Preparation Example, a film having a thickness of 1 mm was formed using a spatula, and visually observed as to whether an aggregate form was present or not. Evaluation was made to check whether the surface of the prepared material was smooth.

[Surface treatment for monodispersed alumina]

Preparation Example 1

30 g of A-1 as a surface treatment agent was dissolved in 100 g of isopropanol to prepare a solution. The prepared solution was dropwise added to 3 kg of F-1 while stirring using SUPERMIXER SMV-20B, manufactured by KAWATA Mfg. Co., Ltd., and then stirred at 60° C. for 20 minutes. Then, the resultant mixture was dried at 110° C. to obtain a mixture of a thermally conductive filler and a surface treatment agent (Preparation Example 1).

Preparation Example 2

A mixture of a thermally conductive filler and a surface treatment agent (Preparation Example 2) was obtained in substantially the same manner as in Preparation Example 1 except that the amount of the surface treatment agent was changed to 90 g.

Preparation Example 3

A mixture of a thermally conductive filler and a surface treatment agent (Preparation Example 3) was obtained in substantially the same manner as in Preparation Example 1 except that, instead of A-1, A-2 was used as a surface treatment agent, and that the treatment temperature was changed to 70° C.

Preparation Example 4

A mixture of a thermally conductive filler and a surface treatment agent (Preparation Example 4) was obtained in substantially the same manner as in Preparation Example 3 except that the amount of the surface treatment agent was changed to 90 g, and that the treatment temperature was changed to 60° C.

Preparation Example 5

A mixture of a thermally conductive filler and a surface treatment agent (Preparation Example 5) was obtained in substantially the same manner as in Preparation Example 3 except that, instead of A-2, A-3 was used as a surface treatment agent, and that the drying temperature was changed to 99° C.

Preparation Example 6

A mixture of a thermally conductive filler and a surface treatment agent (Preparation Example 6) was obtained in substantially the same manner as in Preparation Example 2 except that, instead of A-2, A-3 was used as a surface treatment agent, that the treatment temperature was changed to 90° C., and that the drying temperature was changed to 105° C.

Preparation Example 7

A mixture of a thermally conductive filler and a surface treatment agent (Preparation Example 7) was obtained by substantially the same method as in Preparation Example 1 using F-2 as alumina instead of F-1 and using a solution obtained by dissolving surface treatment agent A-1 in 200 g of isopropanol at a treatment temperature of 100° C. and at a drying temperature of 130° C.

Preparation Example 8

A mixture of a thermally conductive filler and a surface treatment agent (Preparation Example 8) was obtained by substantially the same method as in Preparation Example 1 using F-3 as alumina instead of F-1 at a treatment temperature of 80° C. and at a drying temperature of 105° C. for a stirring time of 15 minutes.

Preparation Example 9

A mixture of a thermally conductive filler and a surface treatment agent (Preparation Example 9) was obtained by substantially the same method as in Preparation Example 1 using F-4 as alumina instead of F-1 at a treatment temperature of 70° C. and at a drying temperature of 110° C. for a stirring time of 15 minutes.

Comparative Preparation Example 1

A mixture of a thermally conductive filler and a surface treatment agent (Comparative Preparation Example 1) was obtained in substantially the same manner as in Preparation Example 1 except that, instead of F-1, F-5 was used as alumina, and that the drying temperature was changed to 112° C.

Comparative Preparation Example 2

Substantially the same procedure as in Comparative Preparation Example 1 was conducted under conditions such that the amount of the surface treatment agent was 90 g, the treatment temperature was 70° C., the stirring time was 15 minutes, and the drying temperature was 110° C., obtaining a mixture of a thermally conductive filler and a surface treatment agent (Comparative Preparation Example 2). The formulations and preparation conditions in Preparation Examples 1 to 9 and Comparative Preparation Examples 1 and 2 are shown in Table 1 below.

TABLE 1

| | Alumina | | Wetter | wt % | Wetter/IPA | Treatment temperature | Stirring time | Drying temperature |
|---|---|---|---|---|---|---|---|---|
| Preparation Example 1 | F-1 | 3 kg | A-1 | 1.0 | 30 g/100 g | 60° C. | 20 minutes | 110° C. |
| Preparation Example 2 | | | | 3.0 | 90 g/100 g | 60° C. | 20 minutes | 110° C. |
| Preparation Example 3 | | | A-2 | 1.0 | 30 g/100 g | 70° C. | 20 minutes | 110° C. |
| Preparation Example 4 | | | | 3.0 | 90 g/100 g | 60° C. | 20 minutes | 110° C. |
| Preparation Example 5 | | | A-3 | 1.0 | 30 g/100 g | 70° C. | 20 minutes | 99° C. |
| Preparation Example 6 | | | | 3.0 | 90 g/100 g | 90° C. | 20 minutes | 105° C. |
| Preparation Example 7 | F-2 | 3 kg | A-1 | 1.0 | 30 g/200 g | 100° C. | 20 minutes | 130° C. |
| Preparation Example 8 | F-3 | 3 kg | A-1 | 1.0 | 30 g/100 g | 80° C. | 15 minutes | 105° C. |
| Preparation Example 9 | F-4 | 3 kg | A-1 | 1.0 | 30 g/100 g | 70° C. | 15 minutes | 110° C. |
| Comparative Preparation Example 1 | F-5 | 3 kg | A-1 | 1.0 | 30 g/100 g | 60° C. | 20 minutes | 112° C. |
| Comparative Preparation Example 2 | | | | 3.0 | 90 g/100 g | 70° C. | 15 minutes | 110° C. |

[Mixing 1 with a Silicone Resin]

The mixtures obtained in Preparation Examples 1 to 6 were individually mixed with siloxane resin B-1 and optionally additional surface treatment agent A-1 or A-2 in the formulations shown in the table below to obtain compositions (Examples 1 to 10). With respect to the obtained compositions, the viscosity and dispersibility were evaluated. The results are shown in Table 2. The "Treatment degree" means a value corresponding to the amount (% by mass) of the surface treatment agent (including the surface treatment agent additionally added) in the composition.

TABLE 2

| Example No. | 1 | 2 | 3 | 4 | 5 | 6 | 7 | 8 | 9 | 10 |
|---|---|---|---|---|---|---|---|---|---|---|
| Treatment degree | 1 | 3 | 1 | 3 | 1 | 3 | 2 | 3 | 2 | 3 |
| B-1 | 24.25 | 22.75 | 24.25 | 22.75 | 24.25 | 22.75 | 23.5 | 22.75 | 23.5 | 22.75 |
| A-1 | | | | | | | 0.75 | 1.5 | | |
| A-2 | | | | | | | | | 0.75 | 1.5 |
| Preparation Example 1 | 75.75 | | | | | | 75.75 | 75.75 | | |
| Preparation Example 2 | | 77.75 | | | | | | | | |
| Preparation Example 3 | | | 75.75 | | | | | | 75.75 | 75.75 |
| Preparation Example 4 | | | | 77.75 | | | | | | |
| Preparation Example 5 | | | | | 75.75 | | | | | |
| Preparation Example 6 | | | | | | 77.75 | | | | |
| Viscosity (Pa · s) | 291 | 73.6 | 345.6 | 115.2 | 470 | 221 | 80 | 48 | 112 | 86.4 |
| Dispersibility | Excellent | Excellent | Excellent | Excellent | Excellent | Excellent | Excellent | Excellent | Excellent | Excellent |

[Mixing 2 with a Silicone Resin]

The mixtures obtained in Comparative Preparation Examples 1 and 2 and untreated monodispersed alumina were individually mixed with polysiloxane resin B-1 in the formulations shown in the table below to obtain compositions (Comparative Examples 1 to 6). Comparative Example 1 is a mixture of untreated monodispersed alumina and a silicone resin. Comparative Examples 2 and 3 correspond to a so-called integral blend method. Comparative Examples 4 to 6 are compounds treated with multidispersed alumina. With respect to the obtained compositions, the viscosity and dispersibility were evaluated. The results are shown in Table 3.

TABLE 3

| Comparative Example No. | 1 | 2 | 3 | 4 | 5 | 6 |
|---|---|---|---|---|---|---|
| Treatment degree | 0 | 1 | 3 | 0 | 1 | 3 |
| B-1 | 25 | 24.25 | 22.75 | 8 | 7.08 | 5.24 |
| A-1 | | 0.75 | 2.25 | | | |
| A-2 | | | | | | |
| F-1 | 75 | 75 | 75 | | | |
| F-5 | | | | 92 | | |
| Comparative Preparation Example 1 | | | | | 92.92 | |
| Comparative Preparation Example 2 | | | | | | 94.76 |
| Viscosity (Pa · s) | Not dispersed | Putty | 230 | Putty | Putty | Putty |
| Dispersibility | — | Aggregation | Aggregation | Excellent | Excellent | Excellent |

From Tables 2 and 3, the followings have been found. As apparent from the Examples, when treating monodispersed alumina by the method of the present invention, a composition having both excellent dispersibility and excellent viscosity can be obtained. On the other hand, as apparent from Comparative Examples 2 and 3, it has been found that, when treating monodispersed alumina by an integral blend method, the obtained composition has suffered aggregation or is in a putty form, and thus cannot be used as a thermally conductive polysiloxane resin.

[Studies on the Particle Diameter of Alumina]

Using aluminas having different average particle diameters, thermally conductive filler compositions were individually obtained by the method of the present invention (Examples 11 to 13) and by an integral blend method (Comparative Examples 7 to 9). Further, two types of aluminas having different average particle diameters were individually prepared by the method of the present invention and by an integral blend method, and these were mixed to obtain thermally conductive filler compositions having mixed a plurality of types of aluminas (Examples 14 and 15 and Comparative Examples 10 and 11). With respect to the obtained compositions, the viscosity and dispersibility were evaluated, and the results of the evaluation as well as the results of Example 1 and Comparative Example 2 are shown in Table 4.

TABLE 4

| Example/Comparative Example No. | Example 1 | Example 11 | Example 12 | Example 13 | Example 14 | Example 15 |
|---|---|---|---|---|---|---|
| Treatment degree | 1 | 1 | 1 | 1 | 1 | 1 |
| B-1 | 24.25 | 24.25 | 16.17 | 16.83 | 24.25 | 21.21 |
| A-1 | | | | | | |

TABLE 4-continued

| Alumina particle diameter(μm) | | | | | | | |
|---|---|---|---|---|---|---|---|
| Preparation Example 1 | 0.55 | 75.75 | | | | 37.875 | |
| Preparation Example 7 | 0.4 | | 75.75 | | | 37.875 | 39.395 |
| Preparation Example 8 | 3 | | | 83.83 | | | 39.395 |
| Preparation Example 9 | 20 | | | | 83.17 | | |
| Alumina F-1 | 0.55 | | | | | | |
| Alumina F-2 | 0.4 | | | | | | |
| Alumina F-3 | 3 | | | | | | |
| Alumina F-4 | 20 | | | | | | |
| Viscosity (P·s) | | 291 | 473 | 48.8 | 22.8 | 512 | 140.2 |
| Dispersibility | | Excellent | Excellent | Excellent | Excellent | Excellent | Excellent |

| Example/Comparative Example No. | | Comparative Example 2 | Comparative Example 7 | Comparative Example 8 | Comparative Example 9 | Comparative Example 10 | Comparative Example 11 |
|---|---|---|---|---|---|---|---|
| Treatment degree | | 1 | 1 | 1 | 1 | 1 | 1 |
| B-1 | | 24.25 | 24.25 | 16.17 | 16.83 | 24.25 | 21.21 |
| A-1 | | 0.75 | 0.75 | 0.83 | 0.17 | 0.75 | 0.79 |
| Alumina particle diameter(μm) | | | | | | | |
| Preparation Example 1 | 0.55 | | | | | | |
| Preparation Example 7 | 0.4 | | | | | | |
| Preparation Example 8 | 3 | | | | | | |
| Preparation Example 9 | 20 | | | | | | |
| Alumina F-1 | 0.55 | 75 | | | | 37.5 | |
| Alumina F-2 | 0.4 | | 75 | | | 37.5 | 39 |
| Alumina F-3 | 3 | | | 83 | | | 39 |
| Alumina F-4 | 20 | | | | 83 | | |
| Viscosity (P·s) | | Putty | 1088 | 63.4 | 26.2 | Putty | 167.8 |
| Dispersibility | | Aggregation | Excellent | Excellent | Excellent | Aggregation | Excellent |

A comparison made between the compositions using the same alumina (with respect to the compositions shown in the same row in Table 4, a combination of the composition shown in the upper portion of the table and the composition shown in the lower portion is such that they have the same formulation and are different from each other in the preparation method) clearly shows that the compositions treated by the method of the present invention have a smaller viscosity and exhibit more excellent handling properties than the compositions treated by an integral blend method. This result is remarkable especially in the alumina having a smaller average particle diameter (the combination of Example 1 and Comparative Example 2 and the combination of Example 11 and Comparative Example 7). Further, in the case of mixing a plurality of types of aluminas, from Table 4, it is apparent that the compositions prepared by the method of the present invention exhibit more excellent viscosity and dispersibility than the compositions treated by an integral blend method. As is apparent from the above, the method of the present invention is effective in producing a thermally conductive filler composition having a reduced viscosity.

The invention claimed is:

1. A method for producing a polyorganosiloxane resin composition, the method comprising:
   a step (a1) of mixing with each other only one kind of a first thermally conductive filler and a first surface treatment agent containing a siloxane to form a first mixture,
   a step (a2) of mixing with each other only one kind of a second thermally conductive filler and a second surface treatment agent containing a siloxane to form a second mixture, and
   a step (b') of mixing (i) the first mixture of the thermally conductive filler and the first surface treatment agent obtained in the step (a1), (ii) the second mixture of the second thermally conductive filler and the second sur-face treatment agent obtained in the step (a2) and (iii) a polyorganosiloxane containing unsaturated groups,
   wherein both the first thermally conductive filler and the second thermally conductive filler have a monomodal particle size distribution,
   wherein the first thermally conductive filler and the second thermally conductive filler have different average particle diameters, and
   wherein the first surface treatment agent and the second surface treatment agent comprise the same siloxane compound represented by a formula (1) or different siloxane compounds represented by the formula (1), the formula 1 having the following structure:

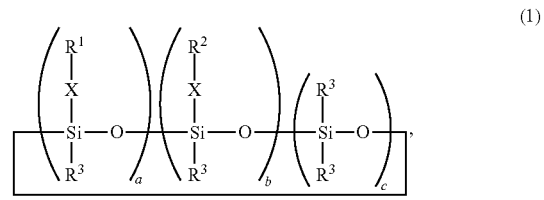

(1)

wherein:
$R^1$ is a group having an alkoxysilyl group having 1 to 4 carbon atoms,
$R^2$ is a monovalent hydrocarbon group having 6 to 18 carbon atoms or a siloxane represented by the following formula (2):

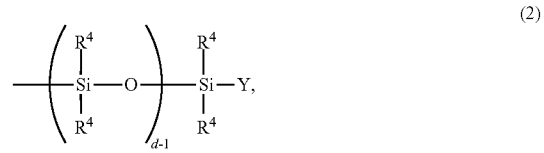

(2)

wherein each $R^4$ independently is a monovalent hydrocarbon group having 1 to 12 carbon atoms, Y is a group selected from the group consisting of $R^1$, $R^4$ and an aliphatic unsaturated group, and d is an integer of 2 to 500, each X independently is a divalent hydrocarbon group having 2 to 10 carbon atoms,
  a is an integer of 1 or more,
  b is an integer of 1 or more,
  c is an integer of 0 or more,
  a+b+c is an integer of 4 or more, and
  each $R^3$ independently is a monovalent hydrocarbon group having 1 to 6 carbon atoms or a hydrogen atom.

2. The method according to claim 1, wherein the first surface treatment agent is in an amount in a range of from 0.1 to 10 parts by mass, relative to 100 parts by mass of the first thermally conductive filler, and the second surface treatment agent is in an amount in a range of from 0.1 to 10 parts by mass, relative to 100 parts by mass of the second thermally conductive filler.

3. The method according to claim 1, further comprising the first surface treatment agent being dissolved in a first solvent, wherein the first surface treatment agent is in an amount of 20% by mass or more, based on the total mass of the first solvent and the first surface treatment agent being 100% by mass, and the second surface treatment agent being dissolved in a second solvent, wherein the second surface treatment agent is in an amount of 20% by mass or more, based on the total mass of the second solvent and the second surface treatment agent being 100% by mass.

4. The method according to claim 3, further comprising:
  subsequent to the step (a1) and prior to the step (b'), a step of stirring the first mixture obtained in the step (a1) at a temperature equal to or higher than the boiling point of the first solvent, and
  subsequent to the step (a2) and prior to the step (b'), a step of stirring the second mixture obtained in the step (a2) at a temperature equal to or higher than the boiling point of the second solvent.

5. The method according to claim 1, wherein each of the first and second thermally conductive fillers is independently selected from the group consisting of alumina, zinc oxide, magnesium oxide, boron nitride, aluminum nitride, a silica powder, silicon carbide, a metal powder, diamond, aluminum hydroxide, carbon, and a mixture thereof.

\* \* \* \* \*